United States Patent
Olson et al.

(10) Patent No.: US 6,710,359 B2
(45) Date of Patent: Mar. 23, 2004

(54) METHODS AND APPARATUS FOR SCANNED BEAM UNIFORMITY ADJUSTMENT IN ION IMPLANTERS

(75) Inventors: Joseph C. Olson, Beverly, MA (US); Rosario Mollica, Wilmington, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 391 days.

(21) Appl. No.: 09/815,484

(22) Filed: Mar. 23, 2001

(65) Prior Publication Data

US 2002/0134948 A1 Sep. 26, 2002

(51) Int. Cl.[7] .......................... H01J 37/00; H01J 37/30
(52) U.S. Cl. ........................ 250/492.21; 250/492.1; 250/492.2; 250/492.22; 250/492.3; 250/397; 250/396; 250/396 R; 250/396 ML; 313/360
(58) Field of Search ...................... 250/492.1, 492.2, 250/492.21, 492.22, 397, 398, 396 R, 396 ML; 313/360, 111.81; 328/233

(56) References Cited

U.S. PATENT DOCUMENTS

| | | |
|---|---|---|
| 3,689,766 A | 9/1972 | Freeman |
| 3,778,626 A | 12/1973 | Robertson |
| 4,021,675 A | 5/1977 | Shifrin |
| 4,421,988 A | 12/1983 | Robertson et al. |
| 4,494,005 A | 1/1985 | Shibata et al. |
| 4,724,324 A | 2/1988 | Liebert |
| 4,922,106 A | 5/1990 | Berrian et al. |
| 5,350,926 A | 9/1994 | White et al. |
| 5,981,961 A | 11/1999 | Edwards et al. |
| 6,403,972 B1 * | 6/2002 | Cucchetti et al. ...... 250/492.21 |
| 6,521,895 B1 * | 2/2003 | Walther et al. ......... 250/396 R |

FOREIGN PATENT DOCUMENTS

| | | |
|---|---|---|
| EP | 0 398 269 | 11/1990 |
| EP | 0 542 560 | 5/1993 |
| WO | WO 01/04926 A1 | 1/2001 |

OTHER PUBLICATIONS

J.C. Olson et al, "Scanned Beam Uniformity Control in the VIISta 810 Ion Implanter", XIIth Int'l. Conf. on Ion Implantation Technology, Jun. 22–26, 1998, Kyoto, Japan, 4 pages.

* cited by examiner

*Primary Examiner*—John R. Lee
*Assistant Examiner*—David A. Vanore

(57) ABSTRACT

Methods and apparatus are provided for adjusting the profile of a scanned ion beam. The spatial distribution of the unscanned ion beam is measured. The ion beam is scanned at an initial scan speed, and the beam profile of the scanned ion beam is measured. If the measured beam profile is not within specification, a scan speed correction that produces a desired profile correction is determined using a calculation which is based on the spatial distribution of the unscanned ion beam. The scan speed correction may be determined by convolving a candidate scan speed correction with the spatial distribution of the unscanned ion beam to produce a result and determining if the result is sufficiently close to the desired profile correction. A multi-dimensional search algorithm may be used to select the candidate scan speed correction. The ion beam is scanned at a corrected scan speed, which is based on the initial scan speed and the scan speed correction, to produce corrected beam profile.

16 Claims, 5 Drawing Sheets

METHODS AND APPARATUS FOR SCANNED BEAM UNIFORMITY ADJUSTMENT IN ION IMPLANTERS

FIELD OF THE INVENTION

This invention relates to systems and methods for ion implantation of semiconductor wafers and other workpieces and, more particularly, to methods and apparatus for adjusting the profile of a scanned ion beam.

BACKGROUND OF THE INVENTION

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement. An ion implanter which utilizes a combination of beam scanning and target movement is disclosed in U.S. Pat. No. 4,922,106 issued May 1, 1990 to Berrian et al.

In the beam scanning approach, an ion beam is deflected by a scanning system to produce ion trajectories which diverge from a point, referred to as the scan origin. The scanned beam then is passed through an ion optical element which performs focusing. The ion optical element converts the diverging ion trajectories to parallel ion trajectories for delivery to the semiconductor wafer. Focusing can be performed with an angle corrector magnet or with an electrostatic lens.

The scanning system typically comprises scan plates to deflect the ion beam and a scan generator for applying scan voltages to the scan plates. The voltages on the scan plates produce an electric field in the region between the scan plates that deflects ions in the ion beam. A scan voltage waveform is typically a sawtooth, or triangular, waveform, which, in combination with wafer movement, distributes the ion beam over the wafer surface.

Uniform implantation of ions across the surface of the semiconductor wafer is an important requirement in many applications. The uniformity may be expressed as a percentage variation in ion dose over the wafer surface. In one approach, a uniformity optimization process is employed to achieve a desired uniformity over the wafer surface. In prior art ion implantation systems, a linear scan waveform is initially applied to the scan plates, so that the scan plates sweep the ion beam in one dimension at a constant rate. The uniformity of the scanned ion beam is measured, and the scan waveform is adjusted to cause a change in the ion beam distribution across the semiconductor wafer. The scan waveform is typically piece-wise linear. Adjustment of the scan waveform involves adjusting values which define the slopes of each of the piece-wise linear segments of the scan waveform. In general, the initial linear scan waveform may not produce the desired uniformity across the semiconductor wafer, and an adjusted scan waveform may be required. The measurement of beam uniformity and adjustment of the scan waveform are repeated until the desired uniformity is achieved.

A typical user of the ion implantation system may need to set up multiple implants of different ion species at different energies and doses. The setup process is typically repeated for each set of implant parameters. The setup process is typically time consuming and reduces the throughput of the ion implanters.

In some cases, the setup process for ion implanters is automated. The automated process may permit a predetermined number of iterations of the uniformity optimization process, wherein the beam uniformity is measured, the scan waveform is adjusted and the beam uniformity is again measured. If the desired uniformity is not achieved in the predetermined number of iterations, the optimization process is terminated. Accordingly, a parameter known as success rate is associated with the automated uniformity optimization process. The process is considered a success if the desired uniformity is achieved within the predetermined number of iterations. In practice, even the automated optimization process can be time consuming and can reduce ion implanter throughput.

Accordingly, there is a need for improved methods and apparatus for optimizing the uniformity of a scanned ion beam.

SUMMARY OF THE INVENTION

According to a first aspect of the invention, a method is provided for adjusting the profile of a scanned ion beam. The method comprises the steps of (a) measuring a spatial distribution $U(x)$ of the unscanned ion beam in a scan direction x, (b) scanning the ion beam at an initial scan speed $W_0(x)$ to produce a scanned ion beam, (c) measuring a beam profile $S(x)$ of the scanned ion beam, (d) determining if the measured beam profile is within specification, (e) if the measured beam profile is not within specification, determining a scan speed correction $C(x)$ that produces a desired profile correction, using a calculation which is based on the spatial distribution $U(x)$ of the unscanned ion beam, and (f) scanning the ion beam at a corrected scan speed $W_c(x)$, which is based on the initial speed $W_0(x)$ and the scan speed correction $C(x)$, to produce a corrected beam profile. In a preferred embodiment, the corrected beam profile is uniform within preselected limits.

The scan speed correction may be determined by selecting a candidate scan speed correction, convolving the candidate scan speed correction with the spatial distribution $U(x)$ of the unscanned ion beam to produce a result and determining if the result is sufficiently close to the desired profile correction. The candidate scan speed correction may be selected by performing a search for the scan speed correction $C(x)$ that produces the desired profile correction. The search may comprise a multi-dimensional search algorithm, such as a downhill simplex algorithm. In a preferred embodiment, the desired profile correction comprises $1/S(x)$ and the corrected scan speed $W_c(x)$ comprises $W_0(x)/C(x)$.

Steps (c)–(f) may be repeated until the beam profile is within specification. The adjustment process may be terminated after a predefined number of iterations of steps (c)–(f) if the beam profile is not within specification and is not improving on successive iterations.

According to another aspect of the invention, apparatus is provided for adjusting the profile of a scanned ion beam. The apparatus comprises means for measuring a spatial distribution $U(x)$ of the unscanned ion beam in a scan direction x, means for scanning the ion beam at an initial scan speed $W_O(x)$ to produce a scanned ion beam, means for measuring a beam profile $S(x)$ of the scanned ion beam, means for determining if the measured beam profile is within specification, means for determining a scan speed correction $C(x)$ that produces a profile correction, if the measured beam profile is not within specification, using a calculation which is based on the spatial distribution $U(x)$ of the unscanned ion beam, and means for scanning the ion beam at a corrected scan speed $W_c(x)$, which is based on the initial scan speed $W_O(x)$ and the scan speed correction $C(x)$, to produce a corrected beam profile.

According to a further aspect of the invention, a method is provided for estimating a beam profile of an ion beam that is scanned in a scan direction x at a scan speed $W(x)$. The method comprises the steps of measuring a spatial distribution $U(x)$ of the unscanned ion beam, and calculating a beam profile $S(x)$ based on the spatial distribution $U(x)$ of the unscanned ion beam and the scan speed $W(x)$. The beam profile $S(x)$ may be calculated by convolving the spatial distribution $U(x)$ and the scan speed $W(x)$.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
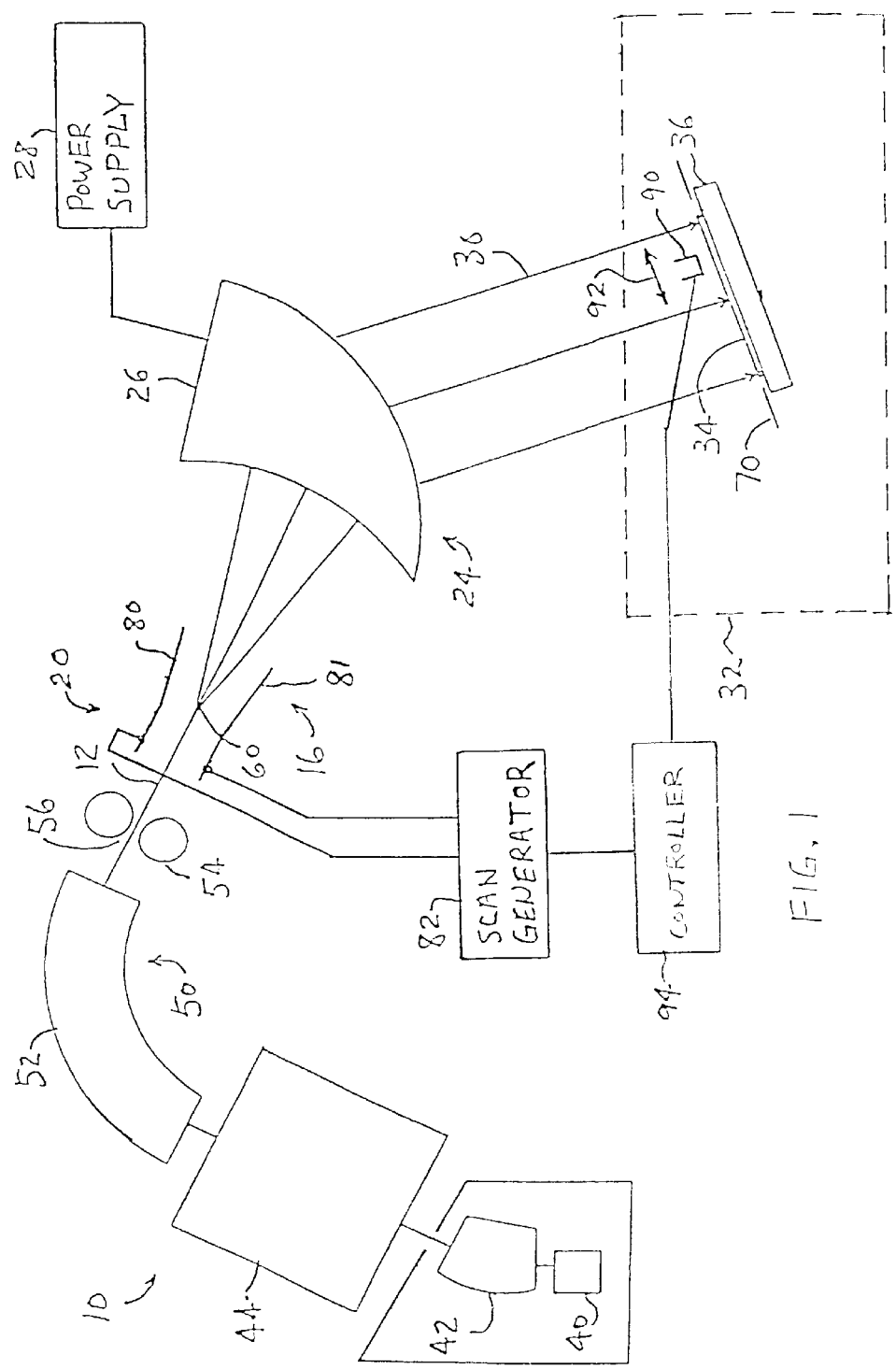
FIG. 1 is a schematic diagram of an ion implanter suitable for implementing the present invention.

A simplified block diagram of an example of an ion implanter suitable for incorporating the present invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12 having low levels of energy and mass contaminants. A scanning system 16, which includes a scanner 20 and an angle corrector 24, deflects the ion beam 12 to produce a scanned ion beam 30 having parallel or nearly parallel ion trajectories. An end station 32 includes a platen 36 that supports a semiconductor wafer 34 or other workpiece in the path of scanned ion beam 30 such that ions of the desired species are implanted into the semiconductor wafer 34. The ion implanter may include additional components known to those skilled in the art. For example, the end station 32 typically includes automated wafer handling equipment for introducing wafers into the ion implanter and for removing wafers after implantation, a dose measurement system, an electron flood gun, etc. It will be understood that the entire path traversed by the ion beam is evacuated during ion implantation.

The principal components of ion beam generator 10 include an ion beam source 40, a source filter 42, an acceleration/deceleration column 44 and a mass analyzer 50. The source filter 42 is preferably positioned in close proximity to the ion beam source 40. The acceleration/deceleration column 44 is positioned between source filter 42 and mass analyzer 50. The mass analyzer 50 includes a dipole analyzing magnet 52 and a mask 54 having a resolving aperture 56.

The scanner 20, which may be an electrostatic scanner, deflects ion beam 12 to produce a scanned ion beam having ion trajectories which diverge from a scan origin 60. The scanner 20 may include spaced-apart scan plates 80 and 81 connected to a scan generator 82. The scan generator 82 applies a scan voltage waveform, such as sawtooth, or triangular, waveform, for deflecting the ion beam in accordance with the electric field between the scan plates 80 and 81.

In one embodiment of scanner 20, scan plates 80 and 81 are powered by +/−20 kilovolt high voltage amplifiers that produce bipolar scan waveforms. The beam is deflected in either direction by the scan waveform. The deflection angle is typically plus or minus 13.5 degrees.

Angle corrector 24 is designed to deflect ions in the scanned ion beam to produce scanned beam 30 having parallel ion trajectories, thus focusing the scanned ion beam. In particular, angle corrector 24 may comprise magnetic polepieces 26 which are spaced apart to define a gap and a magnet coil (not shown) which is coupled to a power supply 28. The scanned ion beam passes through the gap between the polepieces 26 and is deflected in accordance with the magnetic field in the gap. The magnetic field may be adjusted by varying the current through magnet coil. Beam scanning and beam focusing are performed in a selected plane, such as a horizontal plane.

The ion implanter further includes a Faraday beam profiler 90 positioned at or near a plane 70 of wafer 34. The beam profiler 90 is translated parallel to the plane 70 of wafer 34, as indicated by arrows 92. The uniformity of scanned ion beam 30 is determined by translating beam profiler 90 across the plane of the wafer and monitoring beam current. The beam current distribution in the wafer plane is adjusted by altering the shape of the scan waveform as described below. The output current from beam profiler 90 is supplied to a controller 94.

In one embodiment, the controller 94 includes a general purpose computer that is programmed for controlling the setup and operation of the ion implanter. In particular, the controller 94 may be programmed for implementing the uniformity adjustment process described below. In other embodiments, the controller 94 may be a special purpose controller or local controller that is partially or fully dedicated to scan control.

Figure 2:
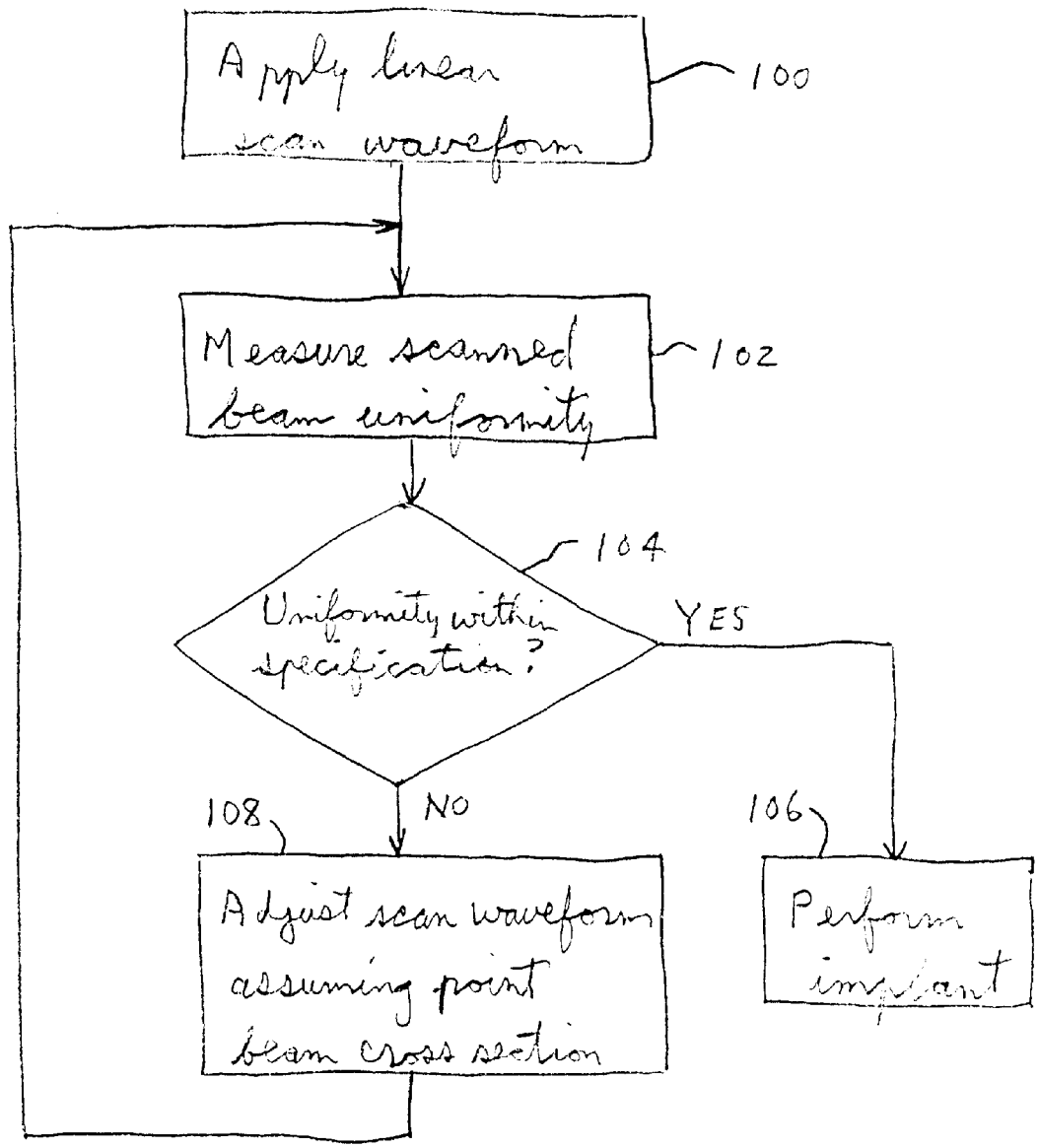
FIG. 2 is a flow chart that illustrates a prior art uniformity adjustment process.

A flow chart of a process for optimizing the uniformity of a scanned ion beam according to the prior art is shown in FIG. 2. In step 100, a linear scan waveform is applied to the scan plates 80 and 81. The uniformity of the ion beam is measured in step 102. In step 104, a determination is made as to whether the uniformity is within specification. If the uniformity is determined in step 104 to be within specification, an implant is performed in step 106. If the uniformity is not within specification, the scan waveform is adjusted in step 108 to achieve the desired uniformity. In particular, the scan waveform is adjusted so that the ion beam is scanned faster to reduce the beam current or scanned more slowly to increase the beam current. As discussed below, the prior art uniformity adjustment process assumes that the unscanned ion beam is a line having zero cross-sectional area. The process then returns to step 102 to repeat the uniformity measurement. The process may require several iterations of the routine including the uniformity measurement and the scan waveform adjustment to achieve the desired uniformity.

The process illustrated in FIG. 2 and described above may be time consuming, particularly where several iterations are required to achieve the desired uniformity. In typical systems where the beam tuning process is automated, the uniformity optimization process shown in FIG. 2 has a predetermined limit on the number of iterations that may be performed. When the predetermined number of iterations has been performed and the uniformity is not within specification, the process is terminated and requires operator intervention. In this case, the beam tuning process is delayed.

In the ion implanter of FIG. 1, the ion beam is scanned horizontally by deflecting it electrostatically. The beam passes between scan plates 80 and 81, which have different electrical potentials. The difference in potential between the scan plates 80 and 81 creates an electric field which accelerates the positive ions toward the more negative of the two scan plates. The deflection of the ion beam alters its position at the end of the beamline, so there is an exact correspondence between the voltage on the scan plates 80 and 81 and the position where the beam is measured. In the best case, this correspondence is linear, but a known nonlinear relationship is acceptable. The potentials on the scan plates 80 and 81 are time-varying voltages, and the ion beam is swept back and forth as a function of time.

The scan waveform may be described mathematically in a number of ways. In one approach, the waveform is described by specifying the voltage as a function of time. However, in a preferred embodiment, the waveform is described by specifying the position of the beam (which corresponds exactly to a voltage) and the rate of sweep of the ion beam at that position. This formulation is convenient because the rate of sweep of the ion beam at a given position is related to the amount of current measured at that position when measuring the profile of the scanned beam. If the beam is swept more slowly at a given position, the measured current at that position increases. Conversely, if the beam is swept more rapidly at a given position, the measured current at that position decreases.

The scan waveform expressed as (position, slope) may be viewed as the derivative of the waveform expressed as (time, voltage). A scan waveform that ramps at a constant rate from −V to +V volts is a line sloping upward if plotted as voltage versus time but is a flat line at a constant height above the axis if plotted as slope versus position. In one embodiment, the scan waveform is expressed as a series of 30 digital values, each of which represents the scan speed at a specified position in the scan.

In theory, a scan waveform with a constant ramp rate of voltage or beam position should produce a beam current that is uniform, i.e., constant at all positions. In practice, this never happens because of aberrations in the beam optics, slight changes in the beam shape as the beam is deflected, nonlinearity in the relationship between voltage and beam position, etc.

In the prior art method of adjusting uniformity, changes to the scan waveform are assumed to be local. Thus, if the beam current is too high at position x, the slope of the waveform is increased at position x to leave the beam at that position a shorter time and decrease the measured current at position x. This approach has difficulties, particularly where the cross section of the unscanned beam is relatively wide. The change in waveform slope at position x causes the scanned beam profile to change over a range of positions corresponding to the width of the beam. Unless the changes to the scan waveform are made in a coordinated manner, corrections at different positions can cancel each other out or can add. The typical result of such corrections is that the uniformity is not within specification. The prior art method has no ability to adjust the waveform in a coordinated way.

If the scanned beam profile could be measured quickly, the slopes could be adjusted and the resulting beam profile could be measured. This approach could be used to systematically search for a scan waveform that produces the best uniformity. In practice, beam profile measurement takes many seconds, so a way to identify promising scan waveforms quickly is needed. A calculation is needed to estimate the effect of varying the entire scan waveform.

A convolution integral is a standard method of calculation where an effect or response is distributed over a range of values of a variable. As described below, the convolution integral can be used to estimate the effect on the scanned beam profile of varying the scan waveform.

Figure 3:
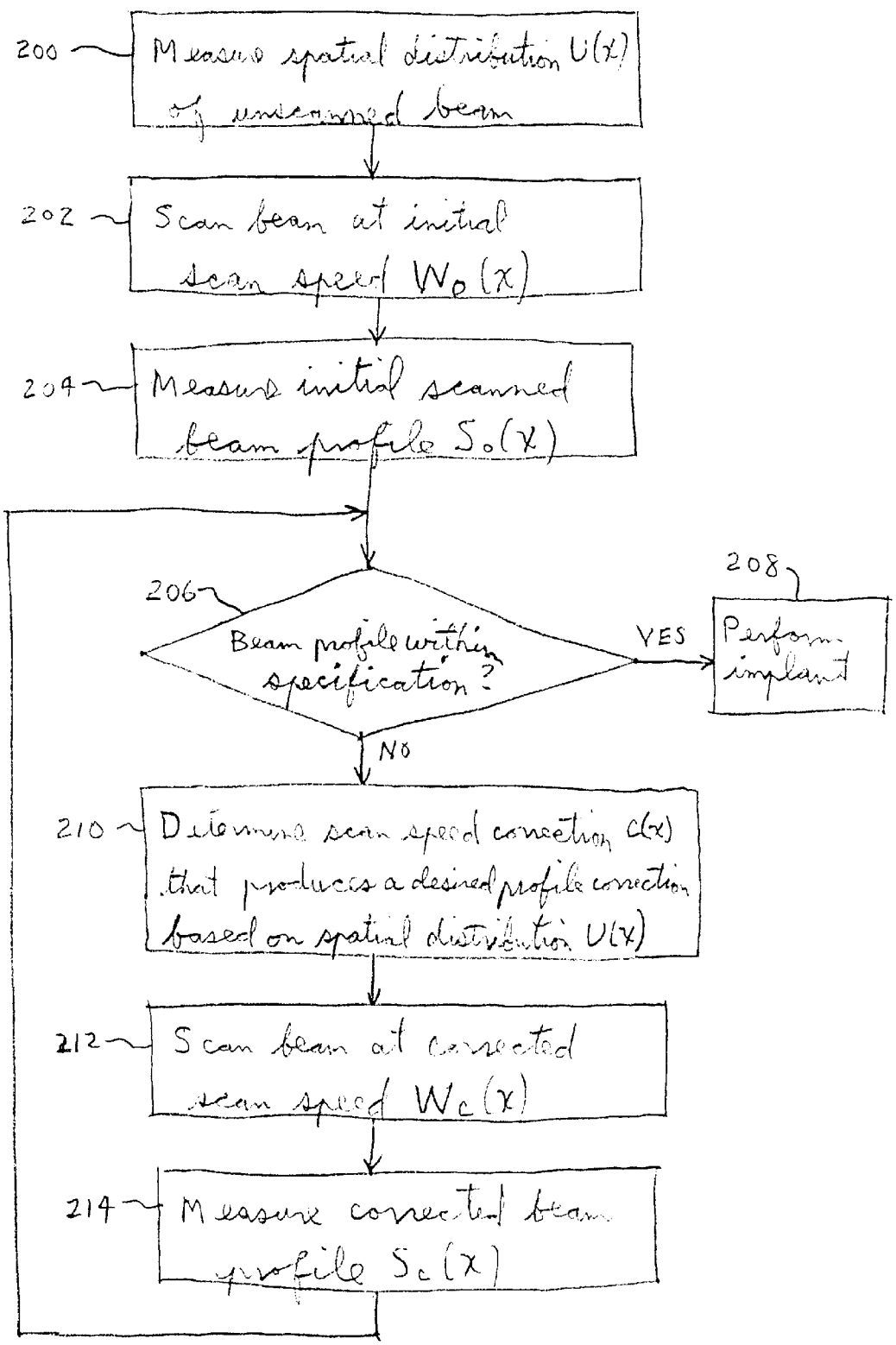
FIG. 3 is a flow chart of a uniformity adjustment process in accordance with an embodiment of the invention.

A flow chart of a method for adjusting the profile of a scanned beam in accordance with an embodiment of the invention is shown in FIG. 3. In step 200, the spatial distribution $U(x)$ of the unscanned ion beam in a scan direction x is measured. In this step, a fixed voltage is applied to scan plates 80 and 81, so that an unscanned ion beam is delivered to target plane 70. Preferably, the unscanned ion beam is positioned at the center of the target plane. The beam profiler 90 is used to determine the spatial distribution $U(x)$ of the unscanned ion beam. The beam profiler 90 is translated in the x direction and supplies measured values of beam current to controller 94. The positioning of the unscanned ion beam and the translation of beam profiler 90 are controlled by controller 94.

Figure 4:
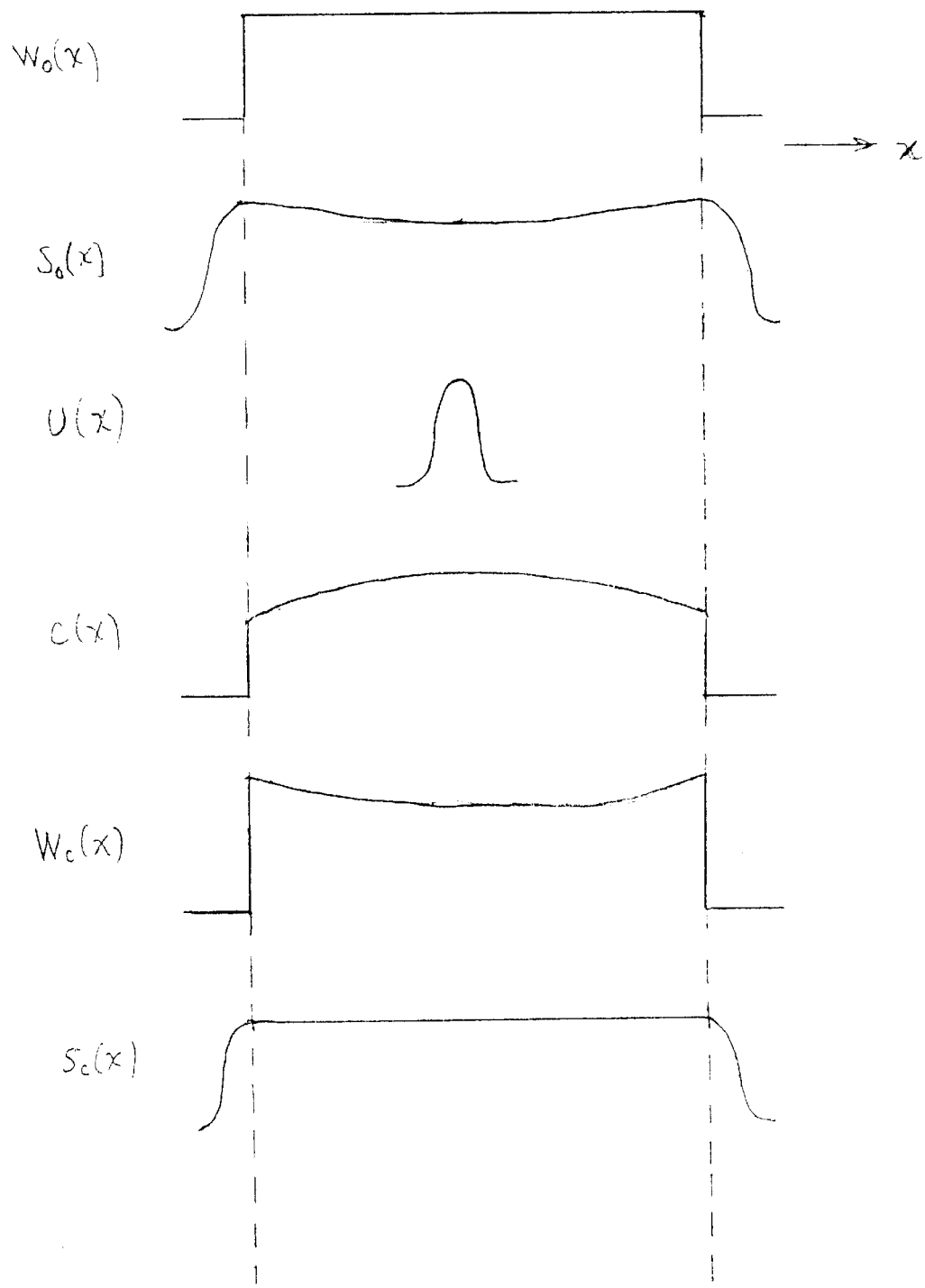
FIG. 4 is a graph that illustrates examples of various parameters, associated with the uniformity adjustment process of the invention, as a function of position x in the wafer plane.

An example of a spatial distribution $U(x)$ of the unscanned ion beam is shown in FIG. 4, with the width of the spatial distribution exaggerated for purposes of illustration. In FIG. 4, each parameter is plotted as a function of position x in the scan direction, with the dashed vertical lines indicating the ends of the scan. It will be understood that the parameters plotted in FIG. 4 are given by way of example only and are not limiting as to the scope of the present invention.

In step 202, the ion beam is scanned at an initial scan speed $W_0(x)$. The controller 94 commands the scan generator 92 to apply an initial scan waveform to scan plates 80 so as to deflect the ion beam at initial scan speed $W_0(x)$. As shown in FIG. 4, the initial scan speed $W_0(x)$ may be a constant scan speed, which corresponds to a linear ramp voltage waveform. Alternatively, an initial scan speed $W_0(x)$ which is known to provide an approximately uniform scanned beam profile for the selected beam parameters may be utilized. In step 204, an initial scanned beam profile $S_0(x)$ is measured with the ion beam scanned at the initial scan speed $W_0(x)$. The beam profiler 90 is translated across the wafer plane in the x direction, and the measured values of beam current are supplied to controller 94, thus providing a scanned beam profile. An example of an initial scanned beam profile $S_0(x)$ shown in FIG. 4 exhibits higher beam current near the ends of the scan than in the center. This would produce the undesirable result of a higher ion dose near the outer edges of the wafer than at the center.

In step 206, a determination is made as to whether the initial scanned beam profile $S_0(x)$ meets a uniformity specification. The uniformity is typically required to be uniform within a given percentage, such as one standard deviation less than 0.5%, over the wafer plane. If the uniformity is within specification, the initial scan speed $W_0(x)$ may be utilized to perform an implant in step 208. If the uniformity is determined in step 206 not to be within specification, an adjustment to the scan waveform is required.

In step 210, a scan speed correction $C(x)$ that produces a desired profile correction is determined. The determination of the scan speed correction $C(x)$ is based on the spatial distribution $U(x)$ of the unscanned ion beam. That is, the scan speed correction takes into account the fact that the ion beam has a finite cross-sectional area and an intensity distribution over its cross-sectional area, rather than treating the ion beam cross section as a point. The scan speed correction $C(x)$ is used to correct the initial scan speed $W_0(x)$ so as to provide a desired scanned beam profile, typically uniform across the width of the scan. A corrected scan speed $W_c(x)$ may be determined by dividing the initial scan speed $W_0(x)$ by the scan speed correction $C(x)$. Alternatively, the corrected scan speed $W_c(x)$ may be determined by multiplying the initial scan speed by a scan speed correction formulated for multiplication. An example of a scan speed correction $C(x)$ is shown in FIG. 4. The process of step 210 for determining the scan speed correction $C(x)$ is shown in greater detail in FIG. 5 and is described below. The corresponding corrected scan speed $W_c(x)$, determined as $W_0(x)/C(x)$, is shown in FIG. 4.

In step 212, the beam is scanned at the corrected scan speed $W_c(x)$. The controller 94 supplies values corresponding to the corrected scan speed at each position to scan generator 82 to deflect the ion beam at the corrected scan speed. In step 214, the corrected beam profile $S_c(x)$ is measured. The corrected beam profile may be measured in the same manner as the initial beam profile. In particular, the beam profiler 90 is translated across the wafer plane, and the measured current values are supplied to controller 94. An example of a corrected beam profile $S_c(x)$ is shown in FIG. 4. The process then returns to step 206 to determine if the uniformity of the corrected beam profile $S_c(x)$ is within specification. If the uniformity is within specification, an implant is performed in step 208. If the uniformity remains outside specification, the adjustment process, including steps 206, 210, 212 and 214, may be repeated until the desired uniformity is achieved.

The adjustment process may include a limit (not shown) on the number of iterations of the adjustment process that may be performed. If the desired uniformity is not achieved within the predefined number of iterations, the adjustment process is terminated and is declared to be unsuccessful. In one approach, the adjustment process is terminated after a predefined number of iterations if the beam profile is not within specification and is not improving on successive iterations. However, the adjustment process may be allowed to continue after the predefined number of iterations if the beam profile is improving on successive iterations.

Figure 5:
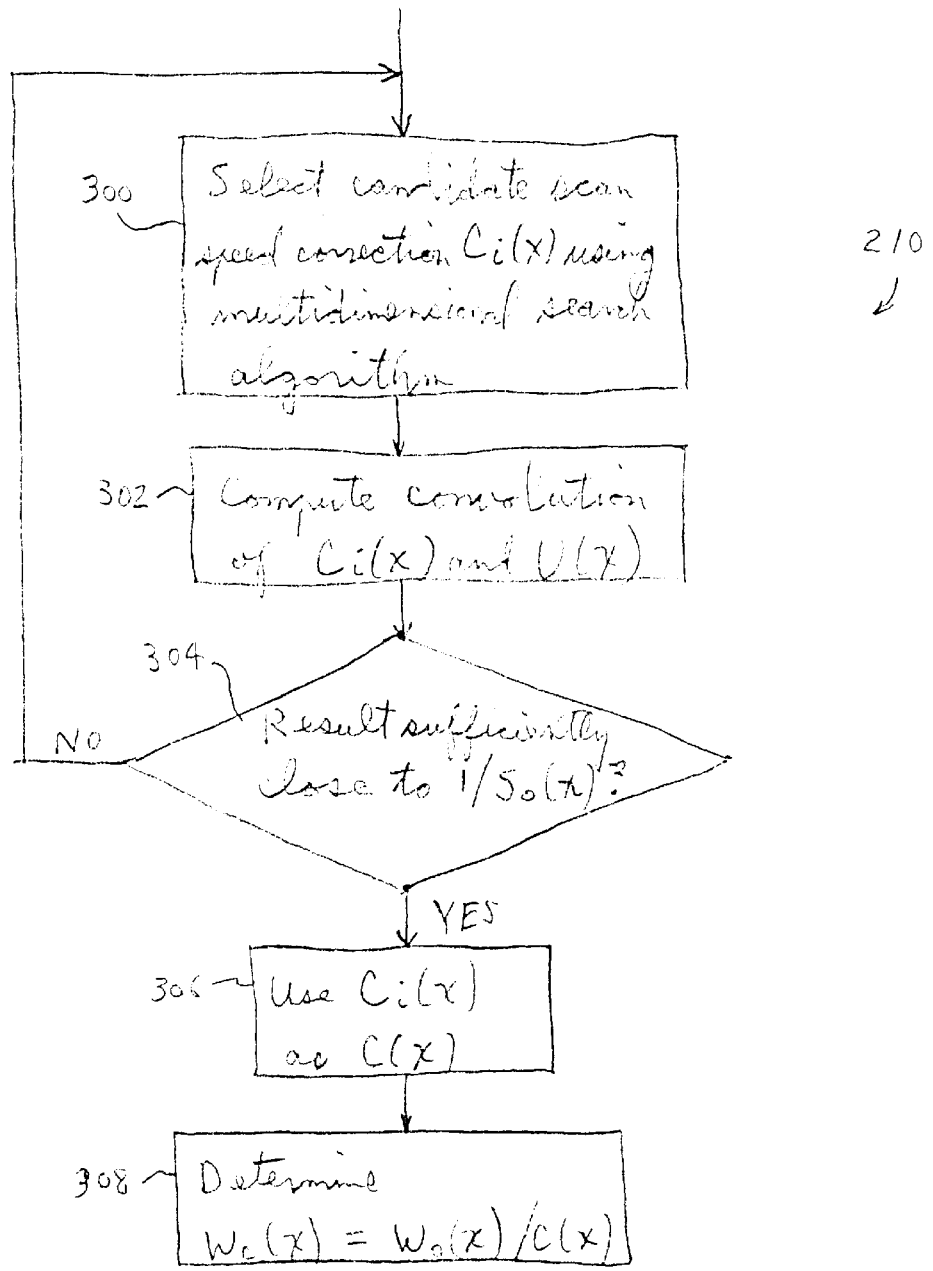
FIG. 5 is a flow chart showing an embodiment of a process for determining a scan speed correction.

A process for determining scan speed correction $C(x)$, corresponding to step 210 in FIG. 3, is shown in FIG. 5. In step 300, a candidate scan speed correction $C_f(x)$ is selected using a multi-dimensional search algorithm. In the example of FIG. 5, it is assumed that the corrected scan speed $W_c(x)$ is calculated as the initial scan speed $W_0(x)$ divided by the scan speed correction $C(x)$. A multi-dimensional search algorithm is utilized because the selection of a candidate scan speed correction involves the adjustment of multiple slopes of the scan waveform. As noted above, the scan waveform may be expressed as a series of values that represent scan speed at each position in the scan. In one embodiment, the scan waveform may be expressed as a series of 30 digital values, each of which represents the scan speed at a different position in the scan. Some or all of the scan speed values may be adjusted to achieve the desired uniformity or other desired beam profile. Furthermore, as described above, the adjustment of scan speed at one position may affect the uniformity at nearby positions because of the spatial distribution of the ion beam. Multi-dimensional search algorithms are known in the art. In a preferred embodiment, a downhill simplex search algorithm is utilized. The downhill simplex search algorithm is described, for example, in *Numerical Recipes in Pascal: The Art of Scientific Computing,* William H. Press et al, Cambridge University Press, 1986, New York, N.Y., pp. 326–331.

In step 302, the convolution of the candidate scan speed correction $C_f(x)$ and the spatial distribution $U(x)$ of the unscanned ion beam is calculated. The convolution integral is known to those skilled in the art. The result of the calculation is an estimated profile correction that would be obtained by utilizing the candidate scan speed correction $C_f(x)$.

In step 304, the result of the convolution calculation is compared with a desired profile correction. In the example of FIG. 5, the desired profile correction is $1/S_0(x)$, the inverse of the initial scanned beam profile $S_0(x)$. A determination is made as to whether the result of the convolution calculation in step 302 is sufficiently close to the desired profile correction $1/S_0(x)$. A comparison is made over the range of values of x, and a decision process is utilized to determine whether the result of the comparison is sufficiently close to the desired profile correction. For example, each comparison point may be required to be within specified limits of the desired profile correction.

If the result of the convolution calculation is not sufficiently close to the desired profile correction, the process returns to step 300, and a new candidate scan speed correction $C_f(x)$ is selected using the multi-dimensional search algorithm. The process is repeated until an acceptable profile correction is obtained.

If the result of the convolution calculation is sufficiently close to the desired profile correction, the candidate scan speed correction $C_f(x)$ is used as the scan speed correction $C(x)$ in step 306. The corrected scan speed is determined in step 308 as $W_0(x)/C(x)$. The process then returns to step 210 of FIG. 3 for evaluation of the corrected scan speed.

The adjustment process of the invention has been described in connection with the typical situation where a uniform beam profile is required. However, the adjustment process of the invention may be utilized to produce any desired beam profile, which may be uniform or nonuniform.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for adjusting the profile of a scanned ion beam, comprising the steps of:
   (a) measuring a spatial distribution $U(x)$ of the unscanned ion beam in a scan direction x;
   (b) scanning the ion beam at an initial scan speed $W_0(x)$ to produce a scanned ion beam;
   (c) measuring a scanned beam profile $S(x)$ of the scanned ion beam;
   (d) determining if the measured beam profile is within specification;

(e) if the measured beam profile is not within specification, determining a scan speed correction $C(x)$ that produces a desired profile correction, using a calculation which is based on the spatial distribution $U(x)$ of the unscanned ion beam; and (f) scanning the ion beam at a corrected scan speed $W_c(x)$ which is based on the initial scan speed $W_0(x)$ and the scan speed correction $C(x)$, to produce a corrected beam profile.

2. A method as defined in claim 1, wherein the step of determining a scan speed correction comprises the steps of selecting a candidate scan speed correction, convolving the candidate scan speed correction with the spatial distribution $U(x)$ of the unscanned ion beam to produce a result and determining if the result is sufficiently close to the desired profile correction.

3. A method as defined in claim 2, wherein the step of selecting a candidate scan speed correction comprises performing a search for the scan speed correction $C(x)$ that produces the desired profile correction.

4. A method as defined in claim 3, wherein the search comprises a multi-dimensional search algorithm.

5. A method as defined in claim 3, wherein the search comprises a downhill simplex algorithm.

6. A method as defined in claim 1, further comprising repeating steps (c)–(f) until the beam profile is within specification.

7. A method as defined in claim 6, further comprising the step of terminating the adjustment process after a predefined number of iterations of steps (c)–(f) if the beam profile is not within specification and is not improving on successive iterations.

8. A method as defined in claim 1, wherein the scan speed correction $C(x)$ comprises a set of discrete values, each of which represents a scan speed correction over a predetermined scan interval.

9. A method as defined in claim 1, wherein the corrected beam profile is uniform within preselected limits.

10. A method as defined in claim 1, wherein the desired profile correction comprises $1/S(x)$ and wherein the corrected scan speed $W_c(x)$ comprises $W_0(x)/C(x)$.

11. Apparatus for adjusting the profile of a scanned ion beam, comprising:

means for measuring a spatial distribution $U(x)$ of the unscanned ion beam in a scan direction x;

means for scanning the ion beam at an initial scan speed $W_0(x)$ to produce a scanned ion beam;

means for measuring a beam profile $S(x)$ of the scanned ion beam;

means for determining if the measured beam profile is within specification;

means for determining a scan speed correction $C(x)$ that produces a desired profile correction, if the measured beam profile is not within specification, using a calculation which is based on the spatial distribution $U(x)$ of the unscanned ion beam; and means for scanning the ion beam at a corrected scan speed $W_c(x)$, which is based on the initial scan speed $W_0(x)$ and the scan speed correction $C(x)$, to produce a corrected beam profile.

12. Apparatus as defined in claim 11, wherein the corrected beam profile is uniform with preselected limits.

13. Apparatus as defined in claim 11, wherein said means for determining a scan speed correction comprises means for selecting a candidate scan speed correction, means for convolving the candidate scan speed correction with the spatial distribution $U(x)$ of the unscanned ion beam to produce a result, and means for determining if the result is sufficiently close to the desired profile correction.

14. Apparatus as defined in claim 13, wherein said means for selecting a candidate scan speed correction comprises means for performing a search for the scan speed correction $C(x)$ that produces the desired profile correction.

15. Apparatus as defined in claim 14, wherein the search comprises a multi-dimensional search algorithm.

16. Apparatus as defined in claim 14, wherein the search comprises a downhill simplex algorithm.

* * * * *